United States Patent
Wilby

(10) Patent No.: US 8,683,880 B2
(45) Date of Patent: Apr. 1, 2014

(54) SEMICONDUCTOR WAFER METROLOGY APPARATUS AND METHOD

(75) Inventor: Robert John Wilby, Bristol (GB)

(73) Assignee: Metryx Limited, Bristol (GB)

( * ) Notice: Subject to any disclaimer, the term of this patent is extended or adjusted under 35 U.S.C. 154(b) by 742 days.

(21) Appl. No.: 12/680,756

(22) PCT Filed: Sep. 30, 2008

(86) PCT No.: PCT/GB2008/003301
§ 371 (c)(1),
(2), (4) Date: Mar. 30, 2010

(87) PCT Pub. No.: WO2009/044121
PCT Pub. Date: Apr. 9, 2009

(65) Prior Publication Data
US 2010/0206098 A1    Aug. 19, 2010

(30) Foreign Application Priority Data
Oct. 4, 2007 (GB) .................................. 0719469.9

(51) Int. Cl.
*G01G 9/00* (2006.01)

(52) U.S. Cl.
USPC ............ 73/865; 73/432.1; 177/180; 177/181; 177/207

(58) Field of Classification Search
USPC .......... 73/433, 435, 436, 432.1, 865.3–865.9; 177/1, 25.13, 50, 180, 181, 238, 207; 702/101, 102
See application file for complete search history.

(56) References Cited

U.S. PATENT DOCUMENTS

| 3,949,295 A | 4/1976 | Moorshead |
| 4,666,005 A | 5/1987 | Komoto |
| 4,713,724 A | 12/1987 | Voelkel |
| 4,783,597 A | 11/1988 | Misawa |

(Continued)

FOREIGN PATENT DOCUMENTS

| DE | 705715 | 3/1941 |
| DE | 3106534 | 10/1982 |

(Continued)

OTHER PUBLICATIONS

Cheng, David K.; "Field and wave electromagnetics"; pp. 95-105; Addison-Wesley Publishing Co.; Syracuse University; Reading, MA.

(Continued)

*Primary Examiner* — Hezron E Williams
*Assistant Examiner* — Hoang Nguyen
(74) *Attorney, Agent, or Firm* — Stites & Harbison PLLC; Douglas E. Jackson

(57) ABSTRACT

A semiconductor wafer metrology technique which corrects for the effect of electrostatic forces on an atmospheric buoyancy compensated weight force measurement of a semiconductor wafer. In one aspect a wafer is weighed in a faraday cage whose is measured independently. A change in the measured weight of the faraday cage can be used to correct the measure weight the wafer. In another aspect a direct electrostatic measurement can be converted into a weight correction using a predetermined correlation between an electrostatic charge measured by the charge meter and a weight error force. In another aspect the electrostatic measurement may be indirect, e.g. derived from varying the distance between the wafer and a grounded plate parallel to the wafer to effect a change in an electrostatic force between the grounded plate and the wafer.

3 Claims, 4 Drawing Sheets

(56) References Cited

U.S. PATENT DOCUMENTS

| | | | |
|---|---|---|---|
| 5,321,634 | A | 6/1994 | Obata et al. |
| 5,625,170 | A | 4/1997 | Poris |
| 5,672,850 | A * | 9/1997 | Liu .......................... 177/210 C |
| 5,719,796 | A | 2/1998 | Chen |
| 5,750,938 | A | 5/1998 | De Caris |
| 6,257,046 | B1 * | 7/2001 | Chu et al. ........................... 73/7 |
| 6,363,294 | B1 | 3/2002 | Coronel et al. |
| 6,515,238 | B1 * | 2/2003 | Martens et al. ............... 177/180 |
| 6,566,614 | B1 | 5/2003 | Flückiger et al. |
| 6,719,142 | B1 * | 4/2004 | Menear et al. ................ 206/711 |
| 6,790,376 | B1 | 9/2004 | Markle et al. |
| 6,965,083 | B2 * | 11/2005 | Reiser .......................... 177/238 |
| 7,020,577 | B2 * | 3/2006 | Wilby ........................... 702/173 |
| 7,119,288 | B2 | 10/2006 | Zaima et al. |
| 7,323,645 | B2 * | 1/2008 | Nufer et al. ................... 177/180 |
| 7,340,372 | B2 * | 3/2008 | Wilby ........................... 702/173 |
| 7,596,984 | B2 * | 10/2009 | Genoud et al. ................ 73/1.13 |

FOREIGN PATENT DOCUMENTS

| | | |
|---|---|---|
| DE | 43 34 470 | 4/1995 |
| DE | 19744618 | 4/1999 |
| DE | 19849399 | 5/2000 |
| EP | 1296367 | 3/2003 |
| JP | 31999008 | 8/1991 |
| JP | 4-32028 | 3/1992 |
| JP | 5129405 | 5/1993 |
| JP | 5-149780 | 6/1993 |
| JP | 2005-274307 | 10/2005 |
| JP | 2007-199061 | 8/2007 |
| WO | WO-02/03449 | 1/2002 |
| WO | WO-2004/008088 | 1/2004 |

OTHER PUBLICATIONS

Courtot-Descharles, A. et al.; "Density functional theory applied to the calculation of dielectric constant of low-k materials," Microelectronics Reliability; 1999; pp. 279-284; vol. 39.

Erjavec, J. et al.; "Novel Parylene-N films deposited at liquid nitrogen temperatures," Materials Letters; Jun. 1999; pp. 339-342; vol. 39, No. 6; North Holland Publishing Company, Amsterdam, NL.

Koima et al.; "Structural characterization of thin films by grazing incidence x-ray reflectivity," Journal of the National Institute of Materials & Chemical Research; 1999; vol. 7, No. 6 (English abstract).

Sammelseig et al.; "Composition and thickness determination of thin oxide films: comparison of different programs and methods," Journal of Analytical Atomic Spectrometry; 1999; vol. 14, No. 3 (English abstract).

Treichel, H. et al.; "Low dielectric constant materials for interlayer dielectric," Microelectronic Engineering; Feb. 1, 1998; pp. 1-19; vol. 40. No. 1; Elsevier Publishers BV, Amsterdam, NL.

Electrostatic Voltmeter Page: Surface DC Voltmeter. http://web.archive.org/web/20061111133710/http://www.trifield.com/SurfaceDCVoltmeter.htm (version of Nov. 11, 2006, from Wayback Machine).

International Search Report for PCT/GB2008/003301, Feb. 16, 2009.

Written Opinion of the Searching Authority for PCT/GB2008/003301, Feb. 6, 2009.

Office Action for Japanese Application No. 2010-527517, May 28, 2013, Japanese Patent Office.

* cited by examiner

SEMICONDUCTOR WAFER METROLOGY APPARATUS AND METHOD

TECHNICAL FIELD

This invention relates to semiconductor wafer metrology.

BACKGROUND TO THE INVENTION

Microelectronic devices are fabricated on semiconductor wafers using a variety of techniques, e.g. including deposition techniques (CVD, PECVD, PVD, etc) and removal techniques (e.g. chemical etching, CMP, etc). Semiconductor e.g. silicon wafers may be further treated in ways that alter their mass e.g. by cleaning, ion implantation, lithography and the like. These treatment techniques typically cause a change in the mass at or on the surface of the semiconductor wafer. The configuration of the changes to the surface are often vital to the functioning of the device, so it is desirable for quality control purposes to assess wafers during production in order to determine whether they have the correct configuration.

Known types of measurement technique may depend on the type of wafer treatment or the properties of materials created by the treatment. For example, treated wafers can be measured using ellipsometry when they contain dielectrics or wafers can be tested using resistivity probes when conductive metals are deposited thereon.

WO 02/03449 discloses an apparatus and method for investigating semiconductor wafers in which changes in the mass of the wafer are determined to assess various properties of the wafer, e.g. enable fabrication of the wafer to be monitored. A common method of obtaining mass measurements is to use a very sensitive force sensor to measure the force (weight) due to gravity. At medium levels of accuracy this force can be assumed to be due solely to the mass of the wafer. However, if higher levels of accuracy are needed, other forces may need to be taken into account.

One such force (disclosed in WO 02/03449) is caused by atmospheric buoyancy. In semiconductor metrology, a semiconductor wafer is usually measured in an atmosphere (i.e. not a vacuum). The wafer therefore displaces a volume of this atmosphere, which causes an up thrust force. The up thrust force depends on the atmospheric (air) density, which in turn depends on numerous factors including temperature, atmospheric pressure, relative humidity and air composition. The up thrust force reduces the apparent weight of the wafer detected by the force sensor.

WO 02/03449 discloses a method of compensating or correcting for the effect of atmospheric buoyancy. Sensors are provided to monitor temperature, pressure and relative humidity. A processor receives measurements from these sensors and uses them to calculate the air density, which can be used to compensate for buoyancy in a corresponding weight measurement. The processor can calculate buoyancy from the calculated air density, together with the weight measurement and density information about the wafer.

The current invention may build on the measurement technique disclosed in WO 02/03449. The inventor has found that when performing sensitive mass measurements on wafers where atmospheric buoyancy is eliminated or suitably compensated other (typically smaller) errors become noticeable. For example, such errors may be caused by pressure effects due to atmospheric movement (air currents) around the wafer and electrostatic forces due to charges on the wafer or surrounding materials. WO 02/03449 noted that these effects were minor compared with atmospheric buoyancy and proposed to limit their effect by performing the weight measurement in a housing (weighing chamber). The chamber was sized to strike a balance between providing a small space to reduce air current effects and spacing surrounding materials far enough away from the wafer to reduce the effect of electrostatic forces. These are conflicting requirements. The present invention proposes a solution which can enable both effects to be reduced.

Electrostatic attraction forces arise when there is a voltage potential difference between the wafer and surrounding material (e.g. walls of an enclosure). Static electricity charges can range from 5-10 V to several kilovolts in magnitude. On a wafer, charges can exist on its surface or within its body (substrate). In the latter case, the charge may be trapped by an insulating coating layer such as silicon oxide or silicon nitride. Charges can be caused by a variety of means, e.g. earlier processing or fabrication steps, tribology, contact electrification, etc. Ionisation devices have previously been proposed as a way of reducing static electricity. However, they are limited because they can only neutralise surface charges and often have unbalanced positive and negative ion streams, which causes them to leave a residual charge.

SUMMARY OF THE INVENTION

At its most general, the present invention proposes correcting for the effect of electrostatic forces on an atmospheric buoyancy compensated weight force measurement of a semiconductor wafer. Compensating for atmospheric buoyancy may include taking steps to eliminate the effect of atmospheric buoyancy.

Semiconductor wafers are typically thin disks (e.g. 200 or 300 mm in diameter and 1 mm thick). This means the majority of any electrostatic force acts normal to the plane of the wafer, e.g. the electrostatic force between a chamber wall and a wafer can be compared with the force between plates in a parallel plate capacitor. Thus, one aspect of the present invention may include isolating and detecting the electrostatic force in this direction and adjusting the weight force measurement according. The electrostatic force exerted on a chamber wall by charges in or on an enclosed wafer is equal and opposite to the electrostatic force exerted on the wafer by the chamber wall.

Accordingly, a first aspect of the invention may provide a method of measuring the mass of a semiconductor wafer, the method including placing the wafer on a sensing element of a first weighing instrument, the sensing element being inside a grounded faraday cage which is on a sensing element of a second weighing instrument whereby the weight of the faraday cage is measurable independently of the weight of the wafer, and determining the mass of the wafer by using a change in the measured weight of the faraday cage measured by the second weighing instrument when the wafer is placed inside the faraday cage to correct the weight of the wafer measured by the first weighing instrument. The sensing element may be a weighing stage such as a weighing pan arranged to transmit a weight force (e.g. connected) to a force sensor in the weighing instrument. The force sensors in the first and second weighing instruments preferably act in the same direction so that correction can be made by subtraction.

Determining the mass of the wafer may further include compensating for buoyancy exerted on the wafer by the atmosphere in the faraday cage. Compensation for or elimination of the effect of atmospheric buoyancy may be by the method disclosed in WO 02/03449, or by any other suitable method, such as using a reference wafer as disclosed in U.S. Pat. No. 5,625,170, using a vacuum or other controlled environment, e.g. purging the chamber with gas having a known composition, temperature, pressure etc.

When the wafer is placed inside the faraday cage, a charge equal to the electrostatic charge in or on the wafer is induced at the inner surface of the cage. Since the faraday cage is grounded, no electric field due to the wafer exists outside the cage. The faraday cage is on a second weighing instrument such that its weight can be measured independently of the wafer (i.e. the mass on the first weighing instrument does not exert a weight force on the second weighing instrument). However, if a charge is induced in the faraday cage, the wafer and faraday cage each experience an equal and opposite electrostatic force due to the electric field between them. This force is representative of the electrostatic charge of the wafer. This force can cause a measurable change in the weight of the faraday cage (measured by the second weighing instrument). This change of weight is due to the electrostatic force. Hence, measuring the change of weight of the faraday cage caused by placing the wafer in the cage is a way of isolating the force caused by the electrostatic charge in or on the wafer. Since the force is equal and opposite to that exerted on the wafer, correction for the electrostatic charge can take place.

Compensating for atmospheric buoyancy may be achieved in any of the manners disclosed in WO 02/03449 or listed above. A typical 300 mm wafer weighing about 128 g can experience a buoyancy force equivalent to about 45 mg. The magnitude of this force can vary over a relative short time by 10-20% (i.e. 4-6 mg).

A second aspect of the invention may provide apparatus for measuring the mass of a semiconductor wafer, the apparatus having: a first weighing instrument for measuring the weight of the wafer; a faraday cage for containing the wafer during measurement; a second weighing instrument for measuring the weight of the faraday cage independently from the wafer. The apparatus may include monitoring means arranged to determine the buoyancy exerted on the wafer by the atmosphere in the chamber.

The monitoring means may include a temperature monitor, a pressure monitor and a humidity monitor arranged to determine the temperature, pressure and humidity in the chamber.

The pressure monitor may include a pressure sensor having an accuracy of better than 0.4% over the range 800-1200 mbar absolute. Temperature sensitivity may be less than 0.02%/° C. Response time may be less than 200 ms. The temperature monitor may have a temperature sensor with an accuracy of better than 0.2° C. and a response time of less than 10 seconds. The humidity monitor may have a humidity sensor with an accuracy of better than 2% and a response time of less than 1 minute.

Each of the weighing instruments may have readability of 0.01 mg over a range of 0-160 g. For larger than 300 mm wafers the range may be extended based on the nominal weight of the wafers. The instrument may have a repeatability of better than 0.03 mg and a temperature sensitivity drift of less than 1 part in $10^6$/° C. The chamber may include a heater, and the interior of the chamber may be maintained at a substantially constant temperature, e.g., within +/−0.1° C. If heated, the enclosure may be maintained within 5° C. of the ambient temperature. A rate of temperature change may also be controlled, e.g. restricted to less than 0.5° C./hr to ensure that temperature through the measurement environment is substantially equal, i.e. that there are no temperature gradients.

The method according to the first aspect presents a way of measuring the electrostatic force caused by the wafer by detecting its effect on the weight measurement of the faraday cage. In an alternative aspect of the invention, the electrostatic charge may be measured. By means of a predetermined correlation between electrostatic charge and effect on weight measurement, a charge measurement may be used to correct a weight measurement.

Thus, a third aspect of the invention may provide a method of measuring the mass of a semiconductor wafer, the method including placing the wafer on a weighing instrument inside a chamber, measuring a electrostatic charge in or on the wafer, and determining the mass of the wafer by using a predetermined correlation between electrostatic charge and weight error force to correct the weight of the wafer measured by the weighing instrument.

The electrostatic charge may be measured by a charge meter that is operable to measure the electric field strength created by the wafer's charge e.g. using a field-mill instrument (e.g. a JCI 140 from John Chubb Instrumentation Limited). Alternatively, the charge may be measured by measuring a charge inducted on a detection plate by using a virtual earth, high impedance charge meter (e.g. a JCI 178 from John Chubb Instrumentation Limited).

As with the previous aspects, determining the mass of the wafer may further include compensating for or eliminating buoyancy exerted on the wafer by the atmosphere in the chamber.

The method may include obtaining the correlation between electrostatic charge and weight error force as an initial step. The correlation can be obtained either by experimental observation or knowledge of the characteristics of a charge meter used to measure the electrostatic charge. The correlation may comprise matching readings from the charge meter with an effect on (e.g. required correction in the reading from) the weighing instrument. For example, this may be done by measuring the weight of a variety of wafers of known mass with different charges so that a statistical distribution can be determined. Alternatively, a single wafer can be charged to a variety of levels either by using a voltage or ionisation source or by contact electrification or tribology. The readings from the charge meter may be measured on a relative scale. An absolute measurement of the charge in Coulombs may not be required. The correlation obtained may be reduced to a best approximation polynomial equation for ease of subsequent calculation. Alternatively, it may be encoded as a computer based look-up table. The charge measurement may therefore be used with the correlation equation to calculate the effect of the charge on the weighing instrument (e.g. gravity force sensor). To determine the mass of the wafer, the weight force value measured by the weighing instrument may be adjusted to reveal the true value of the force of the wafer due to gravity. For example, the predominant effect of the charge can be expressed by the well known classical equation for the force between plates in a parallel plate capacitor (discussed below). These equations can be modified to compensate lesser factors, e.g. edge effects or the like.

The charge in or on the wafer and the weight of the wafer may be measured simultaneously. This prevents possible variations in the charge from affecting the result.

If the electrostatic charge on the wafer is static, i.e. unable to move, the charge distribution may vary across the surface. In this case it is preferable for a detection plate of the charge meter to be substantially the same size and shape as the entire surface of the wafer. Alternatively, if the charge is mobile, e.g. trapped within the conducting or semi-conducting body of the wafer, a smaller detection plate may be used because the charge will be attracted to it. The charge meter may have a detection plate in the form of a disc having a diameter of 2.5 cm (1 inch) or more.

An electric field meter may be able to resolve a wafer charge of at least 0.1 volt at a 25 mm measurement distance (i.e. 25 mm separation between a detection plate and a wafer surface. A charge meter having a detection plate with a diameter of 150 mm may be able to resolve a charge of 1 pC.

A fourth aspect of the invention may provide apparatus for measuring the mass of a semiconductor wafer, the apparatus having: a weighing instrument for measuring the weight of the wafer; a chamber for containing the wafer during measurement; a charge meter for measuring the electrostatic charge in and/or on the wafer; and a processor arranged to correct the weight of the wafer measured by the weighing instrument by using a predetermined correlation between an electrostatic charge measured by the charge meter and a weight error force experienced by the weighing instrument. The apparatus may include monitoring means arranged to determine the buoyancy exerted on the wafer by the atmosphere in the chamber.

In a further aspect, the invention may include a method of correcting a mass measurement for electrostatic force effects by measuring how the effect of the electrostatic force changes. By varying the distance between a parallel grounded plate and a wafer on a weighing pan of a weighing instrument, the change in the electrostatic force between the grounded plate and wafer may be seen in a change in the measured mass. The electrostatic force in this case is inversely proportional to the separation distance. The measured weight values for a plurality of separation distances can be plotted to determine a weight at which the electrostatic force would be zero.

In all the above aspects, it is desirable to prevent the electrostatic charge from increasing during measurement. One way in which this can happen is through contact electrification through grounded surfaces. In conventional metrology techniques, such as those disclosed in WO 02/03449, it is preferable to place the wafer on a thermally conducting surface to ensure that the wafer is at the same temperature as the measurement chamber. However, it has been found that contact between the wafer and the conducting surface can increase the electrostatic charge. To avoid this, the wafer may be electrically insulated when placed on the weighing instrument. This can be achieved by provided an anodised layer (e.g. 10 to 30 μm thick) on the thermally conducting surface (or weighing instrument pan). Alternatively, the pan or thermally conducting surface may be made from or coated with a material that has both good thermal conduction and good electrical insulation, e.g. aluminium nitride. The pan surface may be made of the same material as the undersurface of the wafer.

In a further example, the wafer may be positioned at equal distances between two similar fixed plates (walls). In this case, the electrostatic forces on the wafer from the walls can balance out. The weight error force can therefore be reduced.

Alternatively, a circumferential conductive guard ring can be provided closely around the edge of the wafer to make the closest direction of charge attraction horizontal rather than vertical. This arrangement is particularly suitable for reducing the error effect due to mobile charges in or on the wafer.

BRIEF DESCRIPTION OF THE DRAWINGS

Embodiments of the invention are described below with reference to the accompanying drawings, in which.

DETAILED DESCRIPTION; FURTHER OPTIONS AND PREFERENCES

Figure 1:
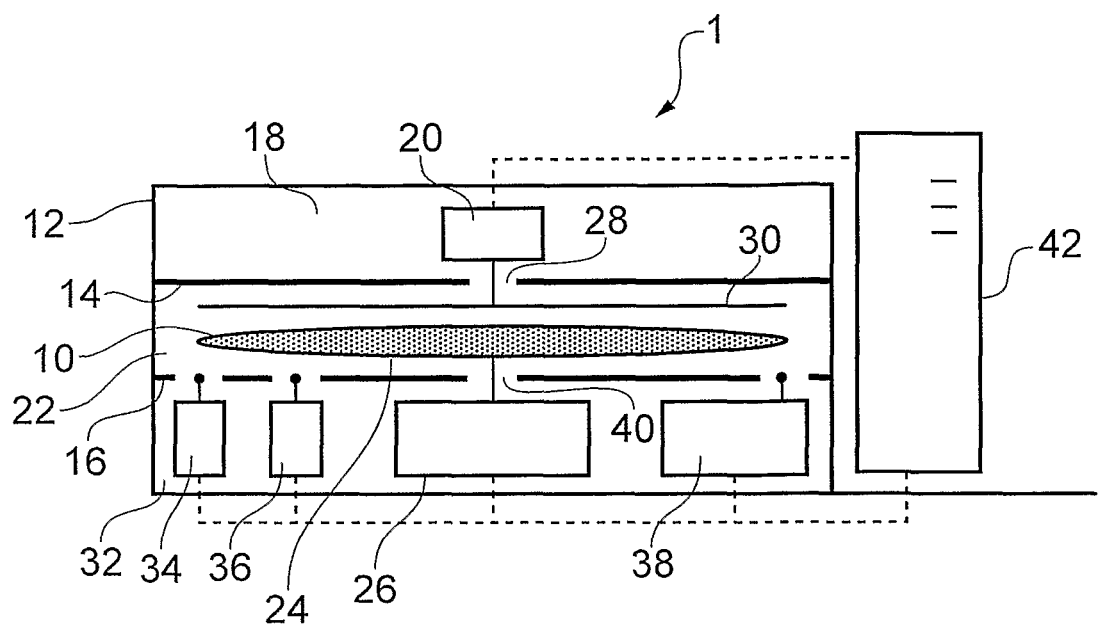
FIG. 1 shows weighing apparatus that is an embodiment of the invention.

FIG. 1 shows weighing apparatus 1 which includes a chamber 12 arranged to enclose a semiconductor wafer 10 and various measuring instruments (discussed below) during a weight measurement. The chamber 12 encloses the system in part to prevent or reduce the effect of air currents in causing errors in the weight measurement.

In FIG. 1, the chamber 12 is partitioned into three portions by partition walls 14, 16. An upper portion 18 contains a charge meter 20, e.g. a Trifield Electrostatic Voltmeter. A middle portion 22 is sized to receive the wafer 10 and also includes the pan 24 of a weighing instrument 26, e.g. a suitable microbalance having 0.01 mg resolution and less than 0.03 mg repeatability (e.g. a Sartorius WZA225-CW). The chamber 12 includes a door (not shown) into the middle portion 22 for deliver and removal of the wafer 10. The partition wall 14 separating the upper and middle portions includes a through hole 28, which allows a sensing plate 30 of the charge meter 20 to be in the middle portion 22 and communicate with the charge meter 20 in the upper portion 18. A lower portion 32 contains the weighing instrument 26, a temperature sensor 34, a humidity sensor 36 and a pressure sensor 38. The partition wall 16 separating the middle and lower portions includes a through hole 40 which allows the pan (i.e. sensing element) 24 to communicate with the weighing instrument. The sensors are mounted such that their sensing elements are located in the middle portion 22 of the chamber 12, with the wafer 10. The pressure sensor 38 may be a Druck PMP4010AB. The temperature and humidity sensors 34, 36 can be combined, e.g. as a Pico RH02.

The charge meter 20, the weighing instrument 26 and each of the sensors 34, 36, 38 are connected to a processor 42, e.g. an external PC or internal microprocessor, which is arranged to obtain simultaneous readings from those devices. The processor 42 contains computer programming that is arranged to use the obtain readings to correct the measured weight value of the wafer 10 (the reading from the weighing instrument 26) for atmospheric buoyancy and any electrostatic interaction between the wafer 10 and its environment. An accurate mass of the wafer 10 may therefore be obtained.

As disclosed in WO 02/03449, the measurements made by the sensors 34, 36, 38 which are fed to the processor 42 allow the air density to be calculated, e.g. using $$\rho_{air} = \frac{0.3485P - 0.00132 \times (0.0398T^2 - 0.1036T + 9.5366) \times H}{(273.14 + T) \times 1000}$$

Where $\rho_{air}$ is the density of air in g/cm$^3$, P is the pressure in mBar, T is the temperature in ° C. and H is the relative humidity expressed as a percentage. The air density can be used to calculate the effect of atmospheric buoyancy on the wafer using the equation:

$$B = \frac{W_w \times \left(\frac{\rho_{air}}{\rho_w} - \frac{\rho_{air}}{\rho_c}\right)}{\left(1 - \frac{\rho_{air}}{\rho_w}\right)},$$

where B is the atmospheric buoyancy effect in grams, $W_w$ is the weight of the wafer sensed by the weighing instrument (in grams), $\rho_{air}$ is the calculated air density in g/cm$^3$, $\rho_w$ is the wafer density in g/cm$^3$, and $\rho_c$ is the density (in g/cm$^3$) of a calibration weight used to calibrate the weighing instrument.

The electrostatic forces between the chamber walls and wafer is analogous to the force experienced by opposite plates in a parallel plate capacitor. In that case, the force F is given by $$F = \frac{\varepsilon \varepsilon_o V^2 A}{2d^2},$$

where $\in$ is the relative permittivity of the material (e.g. dielectric) separating the plates, $\in_0$ is the permittivity of free space, V is the voltage difference between the plates, d is the separation of the plates and A is the area of each plate. Based on this, a 300 mm diameter wafer the electrostatic charge of only 5 V positioned 10 mm away from a grounded surface can experience a force approximately equivalent to 0.1 mg.

In the apparatus of the invention, the actual nature of the force can depend on the specific structure of the chamber. Thus, in this embodiment the processor 42 includes a charge/weight error correlation equation or look up table. The equation or look up table can be used to match a reading from the charge meter to a weight error to be added or subtracted from the weight measurement to correct for electrostatic forces on the wafer.

Figure 5:
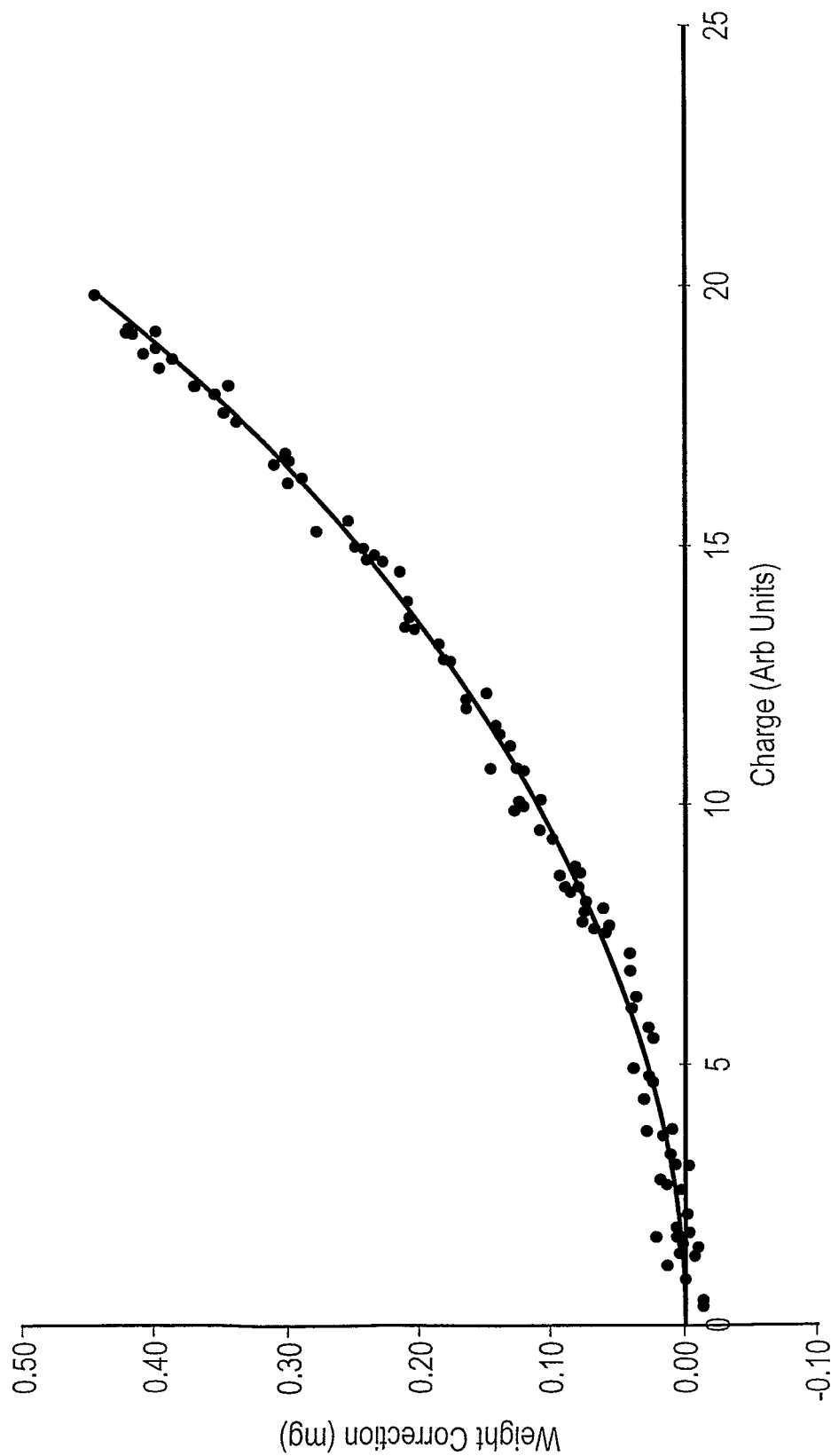
FIG. 5 is a graph showing correlation between weight change and a electrostatic charge.

The charge/weight error correlation equation is obtained previously, e.g. as part of the initial configuration of the apparatus. Either by experimental observation or knowledge of the characteristics of the charge meter a correlation between the readings from the charge meter and the effect on the weighing force sensor is determined. For example, this may be done by using a variety of wafers with different charges so that a statistical distribution can be determined. Alternatively, a single wafer can be charged to a variety of levels either by using a voltage or ionisation source or by contact electrification or tribology. Thus, a wafer of known mass and size can be given a known charge, and the effect of that charge of a weight measurement of the wafer can be observed. FIG. 5 shows a graph contains a plurality of actual measurements (depicted as points) showing the change in a known wafer mass caused by a known electrostatic force. The distribution of points can be then represented as a curve. This curve can then be the basis for linked a measured charge with a weigh correction in use, expressed either as a polynomial equation (e.g. of the form y=ax$^2$+bx) or as a look up table containing points found on the curve.

FIG. 1 shows an apparatus in which the sensing plate 30 of the charge meter 20 lies substantially completely over the wafer 10. This can permit an accurate charge measurement even when there are static charges in the wafer 10.

Figure 2:
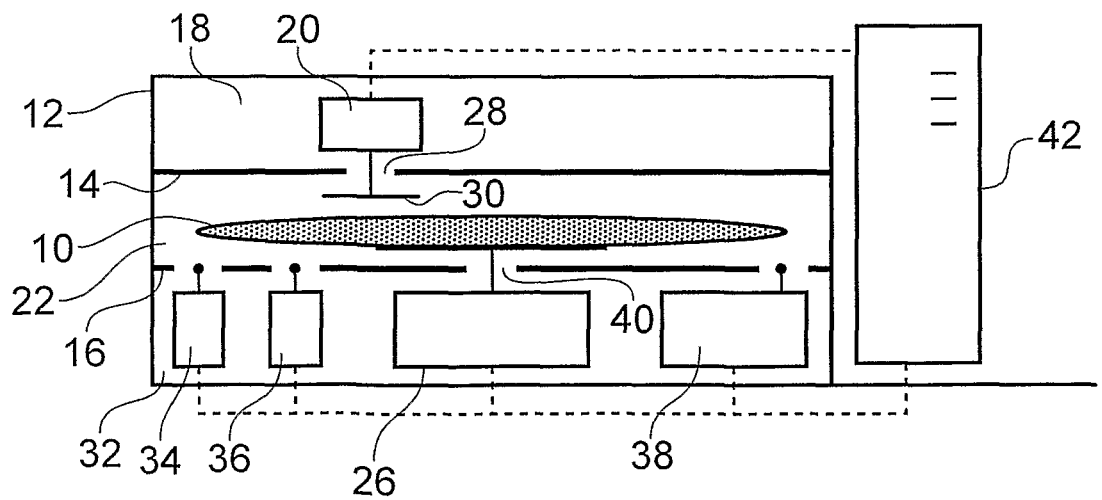
FIG. 2 shows the weighing apparatus of FIG. 1 with a smaller charge detection plate.

FIG. 2 shows another embodiment of the invention. It is the same as the embodiment in FIG. 1 except that the sensing plate 30 is smaller in area than the area of the wafer 10. This arrangement is effective when the charges in the wafer are mobile as well as where there is an evenly distributed static charge.

Figure 3:
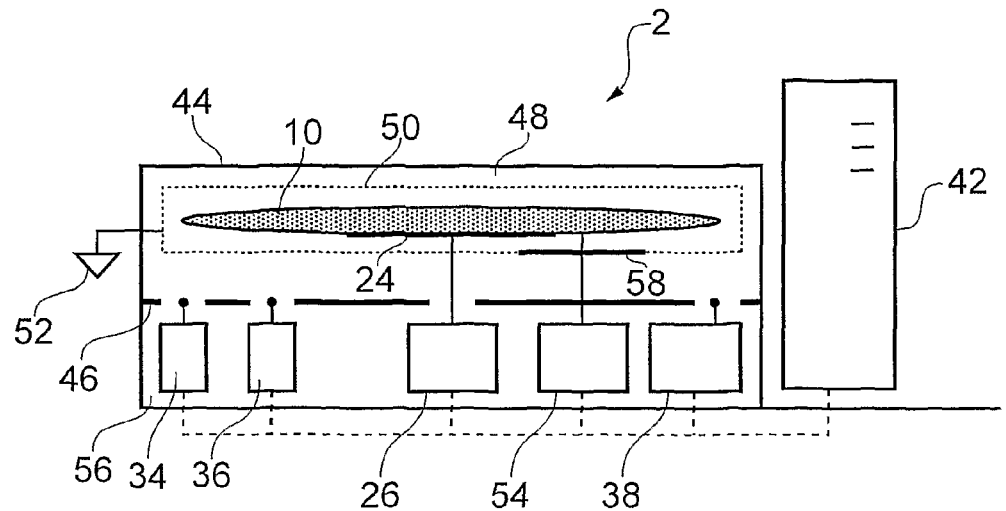
FIG. 3 shows weighing apparatus that is another embodiment of the invention.

FIG. 3 shows a weighing apparatus 2 that is an alternative embodiment of the invention. This embodiment has a chamber 44 whose interior is partitioned by partition wall 46 into an upper portion 48 and a lower portion 56. Similarly to FIG. 1, the lower portion 56 includes a weighing instrument 26, a temperature sensor 34, a humidity sensor 36 and a pressure sensor 38, each of which is arranged to perform the same function as in FIG. 1.

The upper portion 48 of the chamber 44 contains a faraday cage 50 that is electrically connected to ground 52. The faraday cage 50 is arranged to enclose the wafer 10. It includes a door (not shown) for delivery and removal of the wafer 10. When the door is closed, any electrostatic charges in or on the wafer 10 are isolated within the faraday cage 50.

The pan 24 of the weighing instrument 26 is located inside the faraday cage 50 to permit the weight of the wafer 10 to be measured when it is enclosed within the faraday cage 50.

The apparatus 2 shown in FIG. 3 includes a second weighing instrument 54 in the lower portion 56, whose pan 58 is in the upper portion 48, where it supports the faraday cage 50. The weight of the wafer 10 and the weight of the faraday cage 50 are therefore measured independently. This permits a change in the measured weight of the faraday cage 50 caused by placing the wafer inside it to be recorded. This change in weight is due to the electrostatic interaction between the wafer 10 and the faraday cage 50. Since the electrostatic interaction will have an equal and opposite effect on the wafer 10, it is possible to use the change in weight recorded on the second weighing instrument 54 to correct the weight of the wafer 10 measured by the first instrument 26. This correction may be carried out in addition to atmospheric buoyancy compensation by the processor 42.

Figure 4:
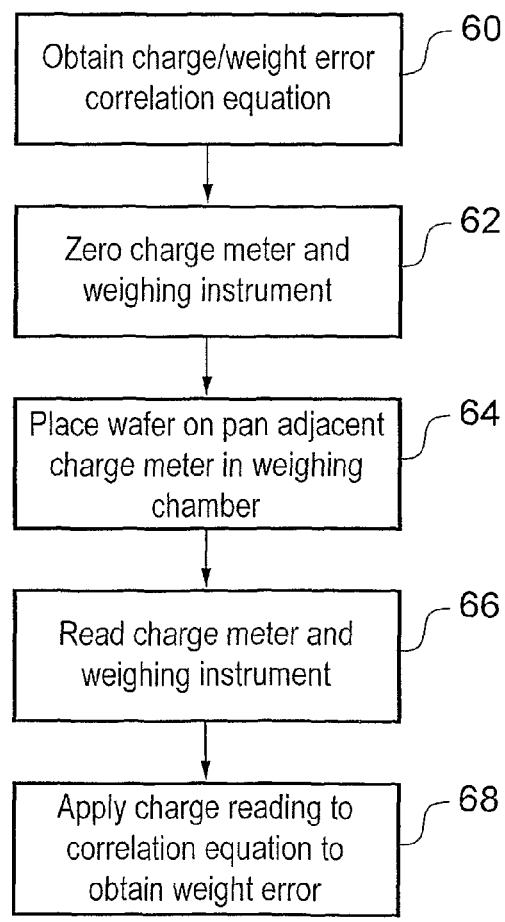
FIG. 4 is a flow chart showing a procedure for weighing a wafer that is an embodiment of the invention.

FIG. 4 shows various steps in a procedure for measuring the mass of a semiconductor wafer using the apparatus in FIG. 1 or 2. A first step 60 is obtaining the charge/weight error correlation equation. As discussed above, this can be done experimentally by measured the weight of wafers which have a known mass and a known charge. A number of wafers can each be measured with a variety of different charges to obtain a statistical distribution which can then be represented by a best fit polynomial equation or a look up table. Likewise, a plurality of correlation equations may need to be obtained for each wafer type (i.e. at different stages in processing) because the distribution of static/mobile charges may change during processing. After the charge/weight error correlation equation is obtained, the procedure continues with steps for measuring the weight of wafers whose mass is unknown. In step 62, the readings on the charge meter and weighing instrument are zeroed before the wafer is inserted into the apparatus. Zeroing may include resetting the readings to zero or recording a pre-measurement value, e.g. to permit differential measurements to be taken. In step 64, the wafer to be measured in inserted into the apparatus and placed on the pan of the weighing instrument. In step 66, after the readings on the charge meter and weighing instrument have stabilised, the value of those readings is taken simultaneously. In step 68, the charge reading is applied to the charge/weight error correlation equation to obtain a weight correction value, which in turn is applied to the weight reading to correct for electrostatic forces due to the measured charge.

For every mass measurement, corresponding readings are taken from the temperature, humidity and pressure sensors in order to perform an atmospheric buoyancy compensation calculation.

Measurements may be taken substantially continuously, e.g. every 0.4 seconds.

Figure 6A:
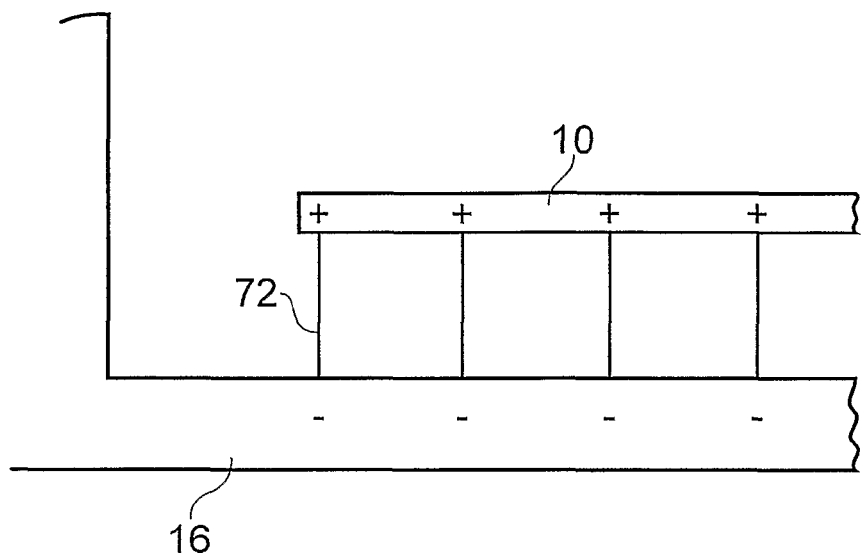
FIGS. 6(a) and 6(b) illustrate the effect of providing a guard ring to deflect the direction of the electrostatic force.
Figure 6B:
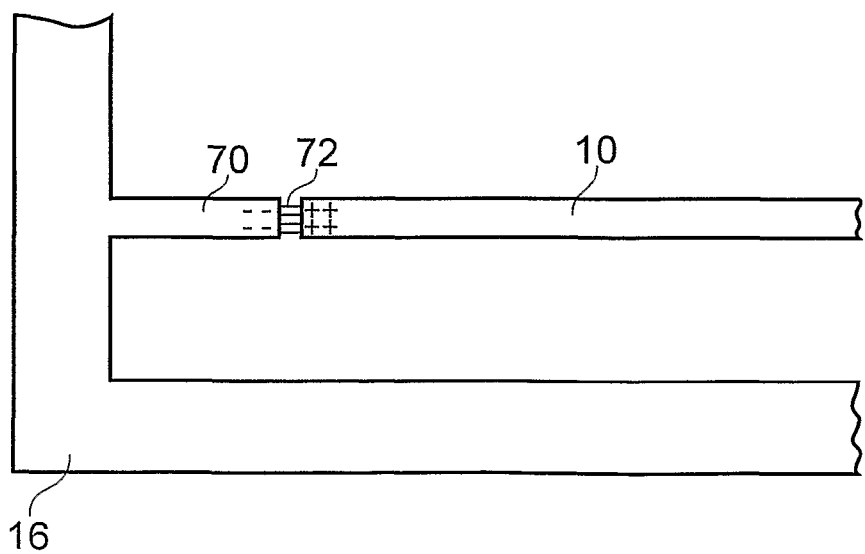

In an improvement to the embodiments discussed above, the direction of the electrostatic force can be deflected away from the vertical direction so that any interference with the weight measurement is reduced. FIG. 6(a) is a schematic diagram showing the direction of electrostatic force 72 between charges (indicated by + signs) on the wafer 10 and induced charges (indicated by − signs) on the nearest partition wall 16 of the chamber 12. The force is in the vertical direction and therefore will affect any measurement of weight. FIG. 6(b) shows an embodiment of the improvement comprising a guard ring 70 which projects from a side wall of the chamber to provide a near point to the wafer 10 at a position transverse to the wafer. As seen in FIG. 6(b), this causes the induced charges in the chamber to be located in the guard ring such that the direction of the electrostatic force is deflected away from the vertical (and in this case is concentrated in the horizontal direction).

The invention proposes measuring apparatus for calculating the mass of a semiconductor wafer in which errors caused by atmospheric buoyancy, electrostatic forces and air currents are compensated for or reduced. How well a measuring apparatus deals with errors can be assumed from the repeatability of measurements (i.e. the range of fluctuation in measurements of the same object over time). The present invention may yield a mass repeatability for a 300 mm diameter semiconductor wafer (mass about 128 g) of less than 0.08 mg.

The invention claimed is:

1. A method of measuring the mass of a semiconductor wafer, the method including:
   placing the wafer on a weighing instrument;
   measuring an electrostatic charge in or on the wafer; and
   using a predetermined correlation between measured electrostatic charge and weight error force experienced by the weighing instrument to correct the weight of the wafer measured by the weighing instrument.

2. A method according to claim 1, wherein the electrostatic charge is measured by a charge meter that is operable to measure the electric field strength created by the wafer's charge.

3. Apparatus for measuring the mass of a semiconductor wafer, the apparatus having:
   a weighing instrument for measuring the weight of the wafer;
   a charge meter for measuring the electrostatic charge in and/or on the wafer; and
   a processor arranged to correct the weight of the wafer measured by the weighing instrument by using a predetermined correlation between an electrostatic charge measured by the charge meter and a weight error force experienced by the weighing instrument.

* * * * *